(12) United States Patent
Berdy et al.

(10) Patent No.: US 9,780,048 B1
(45) Date of Patent: Oct. 3, 2017

(54) SIDE-ASSEMBLED PASSIVE DEVICES

(71) Applicant: QUALCOMM Incorporated, San Diego, CA (US)

(72) Inventors: David Francis Berdy, San Diego, CA (US); Changhan Hobie Yun, San Diego, CA (US); Chengjie Zuo, San Diego, CA (US); Niranjan Sunil Mudakatte, San Diego, CA (US); Mario Francisco Velez, San Diego, CA (US); Shiqun Gu, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/227,919

(22) Filed: Aug. 3, 2016

(51) Int. Cl.
| | |
|---|---|
| H01L 21/60 | (2006.01) |
| H01L 23/66 | (2006.01) |
| H01L 23/64 | (2006.01) |
| H01L 23/00 | (2006.01) |
| H01L 25/18 | (2006.01) |
| H01L 23/538 | (2006.01) |
| H01L 25/00 | (2006.01) |

(52) U.S. Cl.
CPC .......... *H01L 23/66* (2013.01); *H01L 23/5384* (2013.01); *H01L 23/642* (2013.01); *H01L 23/645* (2013.01); *H01L 24/13* (2013.01); *H01L 24/45* (2013.01); *H01L 25/18* (2013.01); *H01L 25/50* (2013.01)

(58) Field of Classification Search
CPC .................................................... H01L 27/224
See application file for complete search history.

(56) References Cited

U.S. PATENT DOCUMENTS

| | | | | |
|---|---|---|---|---|
| 6,418,029 | B1 * | 7/2002 | McKee | H05K 1/023 174/260 |
| 6,903,617 | B2 * | 6/2005 | Lim | H01L 23/66 331/15 |
| 7,361,844 | B2 * | 4/2008 | Vinciarelli | H05K 1/141 174/252 |
| 7,685,703 | B1 | 3/2010 | Devoe et al. | |
| 8,383,949 | B2 * | 2/2013 | Mohammed | H05K 1/181 174/250 |
| 9,190,206 | B1 * | 11/2015 | Luzanov | H05K 1/141 |
| 9,215,807 | B2 | 12/2015 | Arnold et al. | |
| 9,613,841 | B2 * | 4/2017 | Rathburn | H01L 21/6835 |
| 2009/0085704 | A1 * | 4/2009 | Theuss | H01L 23/645 336/200 |
| 2013/0207745 | A1 * | 8/2013 | Yun | H03H 7/1708 333/185 |
| 2015/0371764 | A1 * | 12/2015 | Gordin | H01F 17/0013 336/225 |

\* cited by examiner

*Primary Examiner* — Thao P Le
(74) *Attorney, Agent, or Firm* — Seyfarth Shaw LLP

(57) ABSTRACT

An integrated circuit device includes a first substrate having a ground plane. The integrated circuit device also includes a second substrate. The second substrate has a first layer of passive devices. The passive devices include at least one inductor on a first side of the second substrate. The first layer of passive devices is substantially orthogonal to the ground plane and the second substrate supported by the first substrate. An inductor magnetic field is substantially parallel to the ground plane.

20 Claims, 10 Drawing Sheets

SIDE-ASSEMBLED PASSIVE DEVICES

BACKGROUND

Field

Aspects of the present disclosure relate to semiconductor devices, and more particularly to side-assembled passive devices.

Background

Mobile radio frequency (RF) chip designs (e.g., mobile RF transceivers), including high performance multiplexers have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling.

Passive on glass devices involve high performance inductor and capacitor components that have a variety of advantages over other technologies, such as surface mount technology or multi-layer ceramic chips that are commonly used in the fabrication of mobile radio frequency (RF) chip designs. The design complexity of mobile RF transceivers is complicated by the migration to a deep sub-micron process node due to cost and power consumption considerations. Spacing considerations also affect mobile RF transceiver design at deep sub-micron process nodes. For example, a distance between passive devices (e.g., passive on glass (POG) devices or integrated passive devices (IPD)) and a ground plane of a system board (e.g., a printed circuit broad (PCB)) may negatively affect the performance of the RF devices of the RF transceiver.

SUMMARY

An integrated circuit device includes a first substrate having a ground plane. The integrated circuit device also includes a second substrate. The second substrate has a first layer of passive devices. The passive devices include at least one inductor on a first side of the second substrate, and may optionally include at least one capacitor coupled to the at least one inductor. The first layer of passive devices is substantially orthogonal to the ground plane and the second substrate supported by the first substrate. In this arrangement, an inductor magnetic field is substantially parallel to the ground plane.

An integrated circuit device may include a first substrate having a ground plane. The integrated circuit device also includes a second substrate. The second substrate may have a first layer of passive devices including an inductor(s) on a first side of the second substrate. The first layer of passive devices may be substantially orthogonal to the ground plane, and the second substrate is supported by the first substrate. In this arrangement, an inductor magnetic field is substantially parallel to the ground plane. The integrated circuit device may further includes means for providing lateral support for the second substrate and electrically coupling the first substrate to the first layer of passive devices.

A method of making an integrated circuit device includes arranging a second substrate. The second substrate has a first layer of passive devices. The passive devices include at least one inductor on a first side of the second substrate, on a first substrate and in a direction substantially orthogonal relative to a ground plane of the first substrate. The first substrate has an inductor magnetic field substantially parallel to the ground plane of the first substrate. The method of making an integrated circuit device further includes depositing a conductive interconnect on a surface of the first substrate to laterally support the second substrate and to electrically couple the first substrate to the first layer of passive devices.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1A:
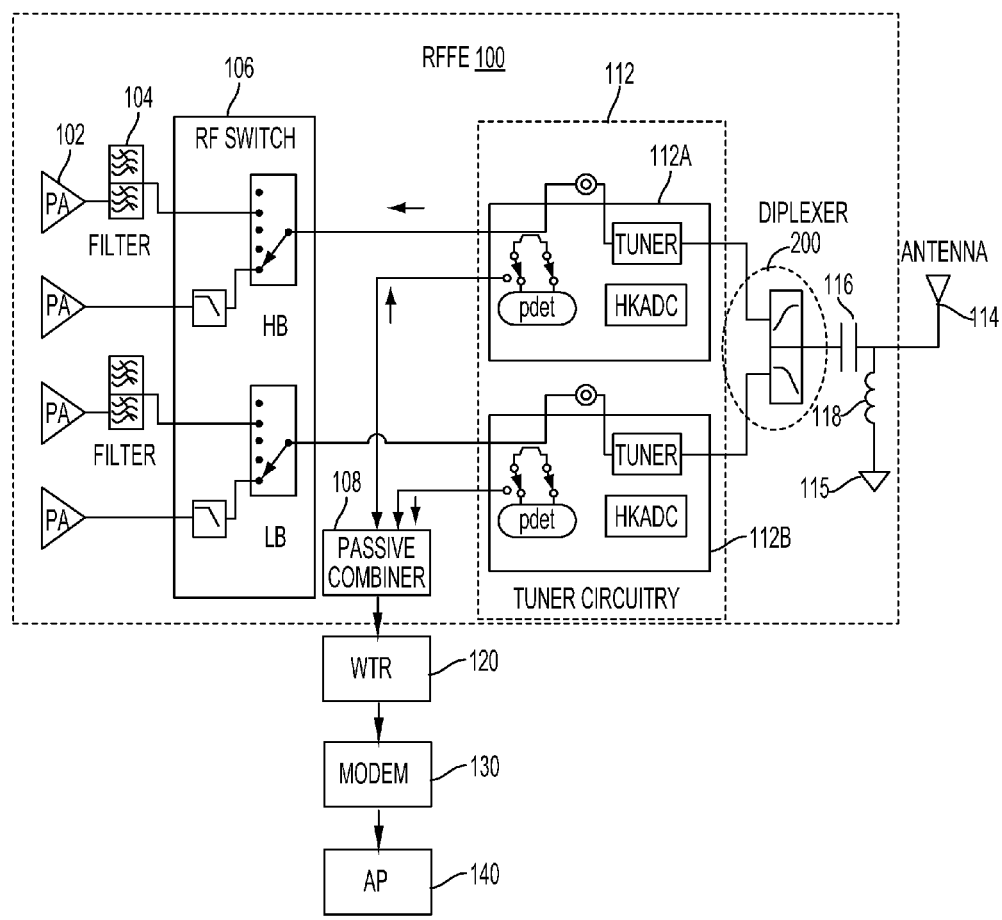
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers), including high performance components have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling.

Successful fabrication of modern semiconductor chip products involves interplay between the materials and the processes employed. In particular, the formation of passive devices during semiconductor fabrication in back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss to support mobile RF transceiver design.

Passive on glass devices involve high performance inductor and capacitor components that have a variety of advantages over other technologies, such as surface mount technology or multi-layer ceramic chips that are commonly used in the fabrication of mobile RF chip designs. The design complexity of mobile RF transceivers is complicated by the migration to a deep sub-micron process node due to cost and power consumption considerations. Spacing considerations also affect mobile RF transceiver design at deep sub-micron process nodes. For example, a distance between passive devices (e.g., passive on glass (POG) devices or integrated passive devices (IPD)) and a ground plane of a system board (e.g., a printed circuit broad (PCB)) may negatively affect the performance of the RF devices of the RF transceiver.

The implementation of carrier aggregation in mobile RF transceivers enables a wireless carrier, owning rights to two frequency bands (e.g., 700 MHz and 2 GHz) in a particular geographic area, to maximize available bandwidth by simultaneously using both frequencies for a single communication stream. While an increased amount of data is provided to the end user, successful implementation of carrier aggregation is complicated by noise created at the harmonic frequencies due to the frequencies used for data transmission. For example, 700 MHz transmissions may create harmonics at 2.1 GHz, which interfere with data broadcast at 2 GHz frequencies. This noise is reduced when passive devices are used to process signals carried in a carrier aggregation system. Unfortunately, eddy currents generated by inductors may negatively affect the performance of mobile RF transceivers when the eddy currents are orthogonal to a ground plane of the system board in the mobile RF transceivers.

Aspects of the present disclosure are directed to side-assembled passive devices. In one arrangement, an integrated circuit (IC) device includes a first substrate having a ground plane. The first substrate may be a printed circuit board (PCB), a packaging substrate, an interposer or other like system board. The integrated circuit device also includes a second substrate (e.g., a passive substrate) having a first layer of passive devices on a first side of the second substrate. The second substrate may be arranged on the first substrate in a direction that is substantially orthogonal relative to the first substrate. In this configuration, the first passive device layer is arranged substantially orthogonal to the ground plane of the first substrate.

According to aspects of the present disclosure, a conductive interconnect may provide lateral support for the second substrate supported by the first substrate. For example, a first solder ball on the surface of the first substrate may provide lateral support for the second substrate. The solder ball may also electrically couple the first substrate to the first passive device layer. Alternatively, the IC device includes a first solder ball on the surface of the first substrate, providing lateral support to the second substrate. The first solder ball electrically couples the first substrate to the first passive device layer. The IC device also includes a second solder ball on the surface of the first substrate, providing lateral support to the second substrate. The second solder ball electrically couples the first substrate to a second layer of passive devices opposite the first passive device layer on a second surface of the second substrate.

For wireless communication, passive devices are used to process signals in a carrier aggregation system. In carrier aggregation systems, signals are communicated with both high band and low band frequencies. In a chipset, a passive device (e.g., a diplexer) is usually inserted between an antenna and a tuner (or a radio frequency (RF) switch) to ensure high performance. Usually, a diplexer design includes inductors and capacitors. Diplexers can attain high performance by using inductors and capacitors that have a high quality (Q)-factor. High performance diplexers can also be attained by reducing the electromagnetic coupling between components, which may be achieved through an arrangement of the geometry and direction of the components.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
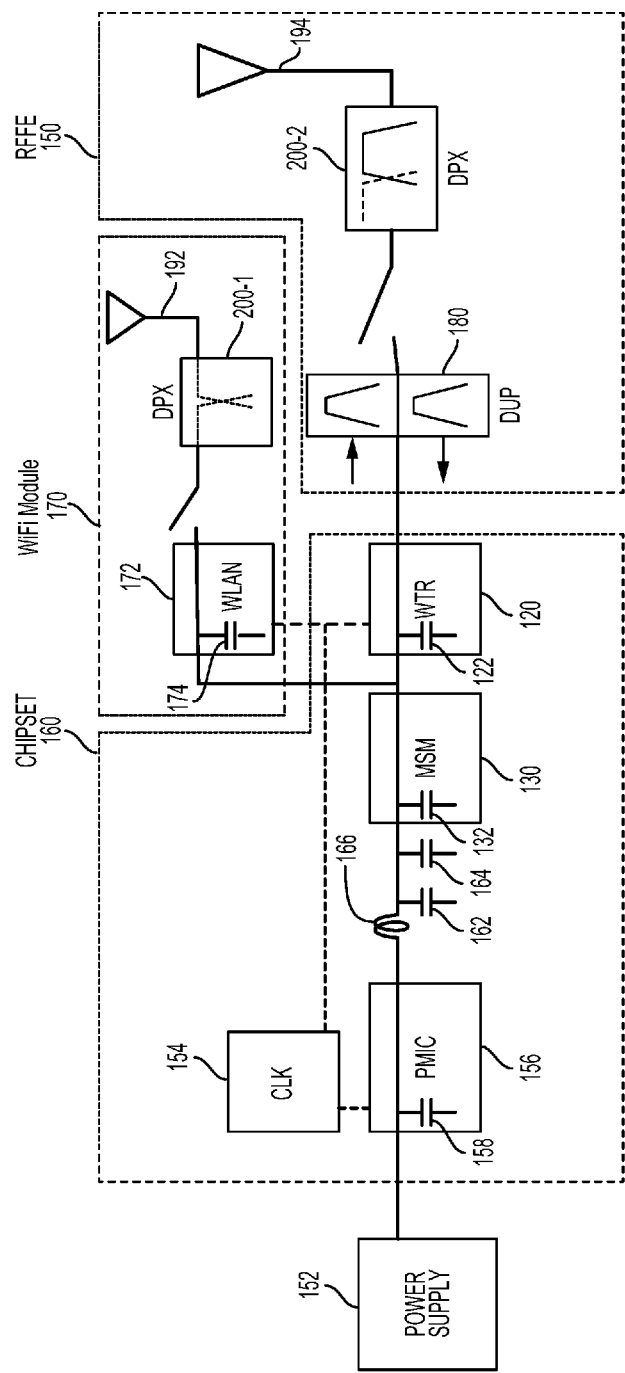
FIG. 1B is a schematic diagram of a radio frequency (RF) front end (RFFE) module employing diplexers for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end (RFFE) module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
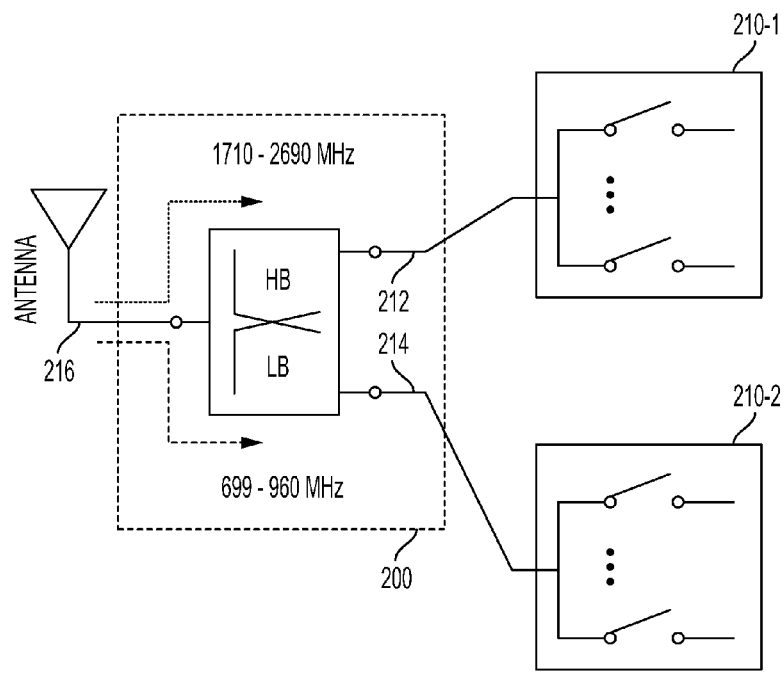
FIG. 2A is a diagram of a diplexer design in accordance with an aspect of the present disclosure.

FIG. 2A is a diagram of a diplexer 200 according to an aspect of the present disclosure. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
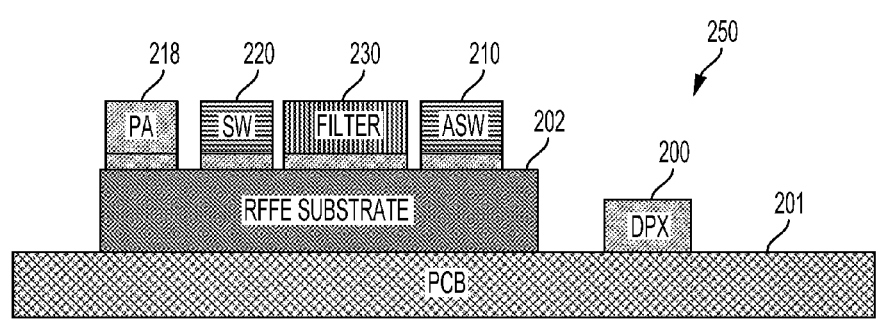
FIG. 2B is a diagram of a radio frequency (RF) front end (RFFE) module in accordance with an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250.

In this configuration, the diplexer 200 is implemented as a surface mount device (SMD) on a system board 201 (e.g., printed circuit board (PCB) or package substrate). By contrast, the antenna switch 210 is implemented on the substrate 202 supported by the system board 201 of the RF front end module 250. In addition, the various LC filters of the filters 230 are also implemented as surface mount devices on the substrate 202 of the RF front end module 250. Although shown as filters 230, the LC filters including a low pass filter(s) and/or a notch filter(s) may be arranged throughout the substrate using pick and place technology to prevent high order harmonics in the RF front end module 250.

The RF front end module 250 may include inductors (L) and capacitors (C) arranged to form diplexers, a triplexers, multiplexers, low pass filters, balun filters, and/or notch filters to prevent high order harmonics. These passive devices and components may be implemented as passive on glass devices, integrated passive devices, or other like passive devices. The inductors may be three-dimensional (3D) inductors or two-dimensional (2D) spiral inductors. Arrangement of these passive devices may be performed and selected to improve device performance, while suppressing unwanted noise (e.g., artificial harmonics) to support advance RF applications such as carrier aggregation. One possible configuration of these passive devices is an arrangement of the passive devices within a passive device layer, for example, as shown in FIG. 3.

Figure 3:
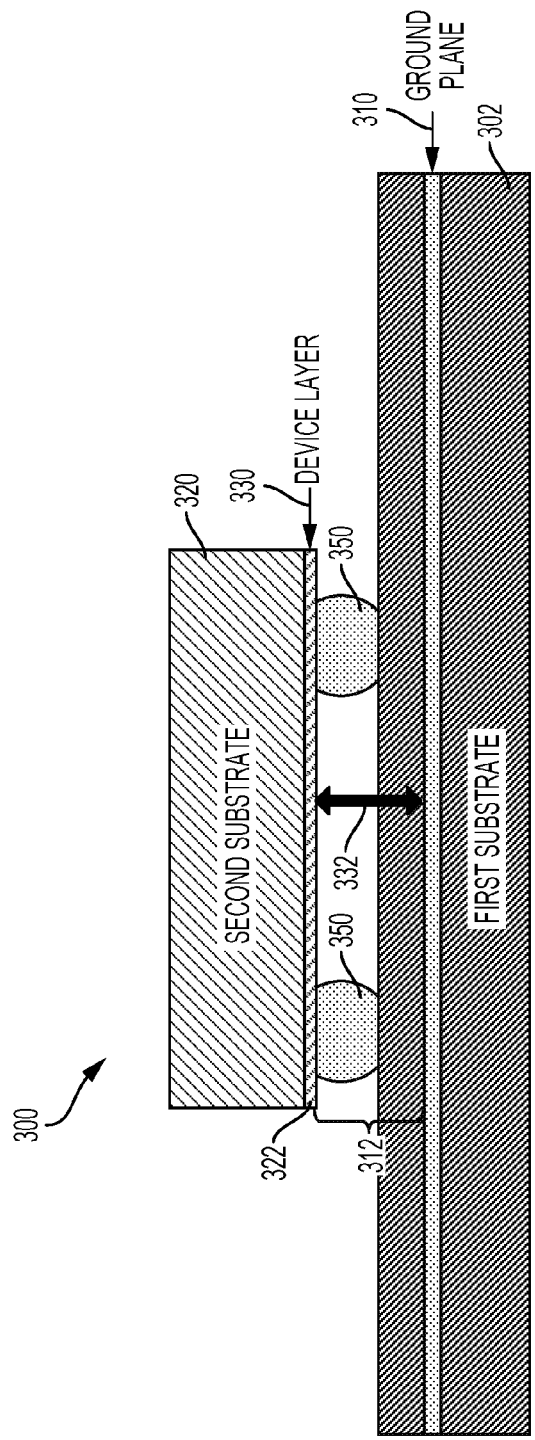
FIG. 3 is a block diagram of a side view of an integrated circuit (IC) device including a passive device layer according to aspects of the present disclosure.

FIG. 3 is a block diagram of a side view of an integrated circuit device 300 including a first passive device layer according to aspects of the present disclosure. In this configuration, the integrated circuit device 300 includes a first substrate 302 having a ground plane 310. The first substrate 302 may be a printed circuit board (PCB), a packaging substrate, a wafer level chip scale package (WLCSP), an interposer, or other like system board. The integrated circuit device 300 also includes a second substrate 320 (e.g., a passive substrate) having a first passive device layer 330 on a first side 322 of the second substrate 320. As described herein, the term "passive substrate" may refer to a substrate of a diced wafer or panel, or may refer to the substrate of a wafer/panel that is not diced. In one configuration, the passive substrate is comprised of glass, air, quartz, sapphire, high-resistivity silicon, or other like passive material. The passive substrate may also be a coreless substrate.

The first passive device layer 330 may include passive devices and components implemented as passive on glass devices, integrated passive devices, or other like passive devices, for example, as shown in FIGS. 2A and 2B. The first passive device layer 330 may include, for example, the inductors (L) and capacitors (C) arranged along the substrate 202. These various inductors and capacitors may be arranged in the first passive device layer to form diplexers, a triplexers, low pass filters, balun filters, and/or notch filters to prevent high order harmonics in the RF front end module 250, as shown in FIG. 2B.

FIG. 3 also shows a distance 312 between the first passive device layer 330 and the ground plane 310 of the first substrate 302. In operation, the distance 312 between the first passive device layer 330 and the ground plane 310 of the first substrate 302 may negatively affect the operation of the integrated circuit device 300. In particular, eddy currents generated by an inductor magnetic field 332 from the first passive device layer 330 may negatively interact with the ground plane 310. The negative interaction is especially acute when a direction of the magnetic field 322 is orthogonal to the ground plane 310. In particular, when the distance 312 is less than three-hundred (300) microns, the inductor magnetic field 332 from the first passive device layer 330 interacts with the ground plane 310, which negatively affects a performance (e.g., a quality (Q)-factor) of the passive devices in the first passive device layer 330.

Unfortunately, solving this problem by simply controlling the distance 312 is difficult because the specification of the ground plane 310 of the first substrate 302 generally varies according to a specific design and/or customer specifications. In addition, controlling the height of the conductive interconnects 350 (e.g., solder balls) that couple the first substrate 302 to the second substrate 320 is challenging due to the complex assembly process for fabricating the integrated circuit device 300. Various aspects of the present disclosure provide techniques for side-assembled passive devices. In one configuration, a passive device layer is arranged substantially orthogonal to a ground plane, for example, as shown in FIG. 4.

Figure 4:
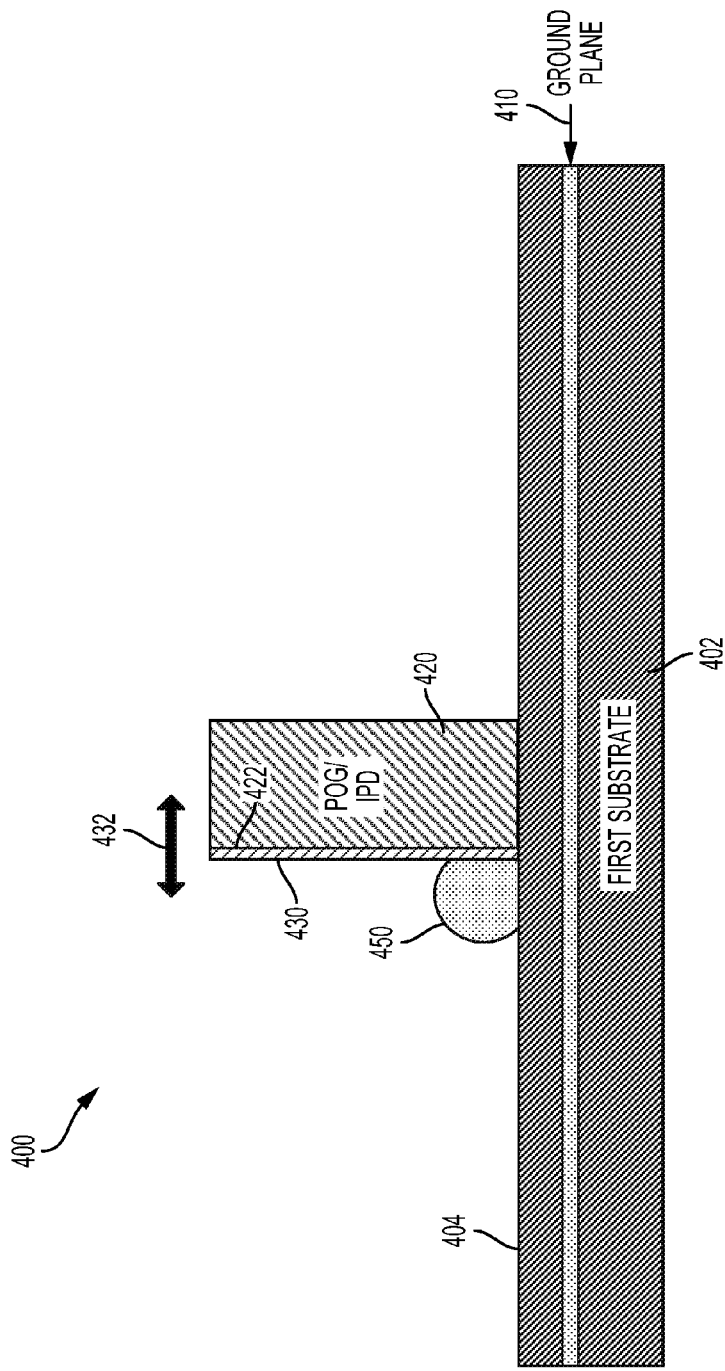
FIG. 4 is a block diagram illustrating an integrated circuit (IC) device having side-assembled passive devices, according to aspects of the present disclosure.

FIG. 4 is a block diagram illustrating an integrated circuit device 400 having side-assembled passive devices, according to aspects of the present disclosure. In this configuration, the integrated circuit device 400 also includes a first substrate 402 having a ground plane 410 along a length of the first substrate 402. The first substrate 402 may be a printed circuit board (PCB), a packaging substrate, a wafer level chip scale package (WLCSP), an interposer, or other like system board. The integrated circuit device 400 also includes a second substrate 420 (e.g., a passive substrate) having a first passive device layer 430 on a first side 422 of the second substrate 420. The first passive device layer 430 includes an inductor (not shown) having an inductor magnetic field 432. The first passive device layer 430 may include passive devices and components implemented as passive on glass devices, integrated passive devices, or other like passive devices, for example, as shown in FIGS. 2A and 2B.

In this configuration shown in FIG. 4, however, the second substrate 420 is arranged in a direction substantially orthogonal relative to a ground plane 410 of the first substrate 402. In this arrangement of the second substrate 420, the inductor magnetic field 432 is substantially parallel to the ground plane 410 of the first substrate 402. As a result, the ground plane 410 does not degrade the performance of the passive devices in the first passive device layer 430. Instead, by arranging the substrate 420 in a direction substantially orthogonal relative to the ground plane 410 of the first substrate 402, the inductor magnetic field 432 is substantially parallel to the ground plane 410 of the first substrate 402 to prevent the negative interaction.

In addition, a conductive interconnect 450 (e.g., a solder ball) is fabricated on a surface 404 of the first substrate 402 to provide lateral support for the second substrate 420. The conductive interconnect 450 electrically couples the first substrate 402 to the first passive device layer 430. In alternative configurations of the integrated circuit device 400, either a wire bond or a solder paste may couple the first passive device layer 430 to the first substrate 402.

Figure 5:
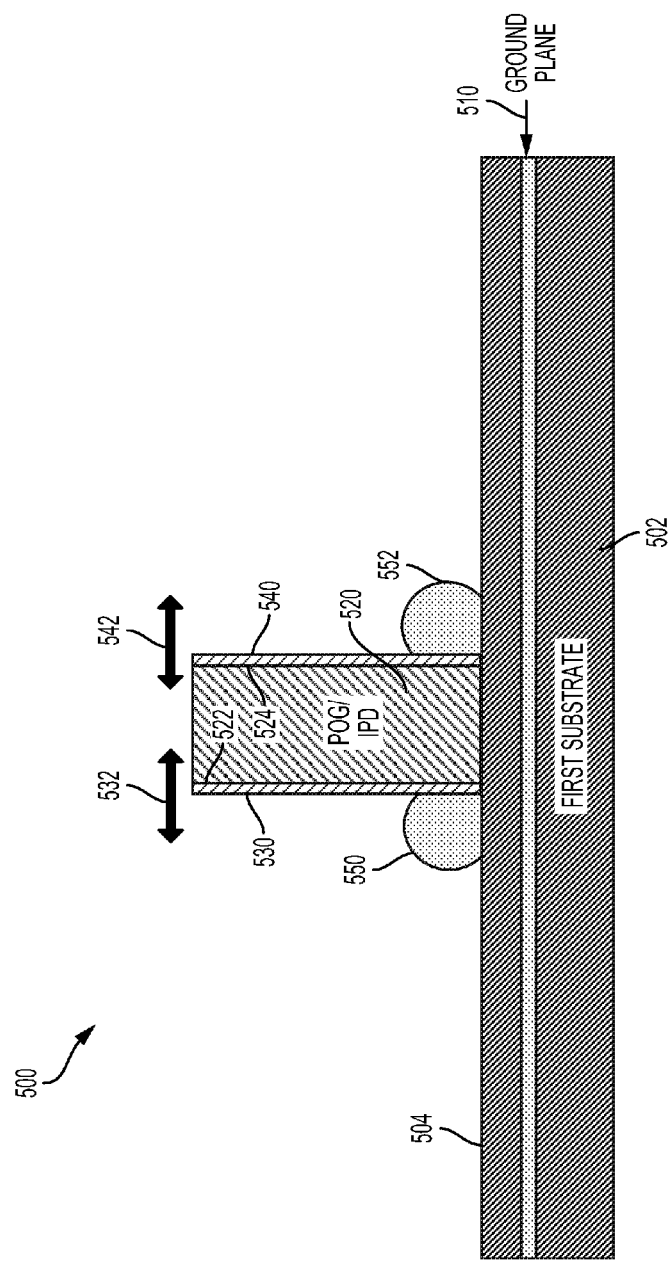
FIG. 5 is a block diagram illustrating an integrated circuit (IC) device having dual-layer side-assembled passive devices, according to aspects of the present disclosure.

FIG. 5 is a block diagram illustrating an integrated circuit device 500 having dual-layer side-assembled passive devices, according to aspects of the present disclosure. In this configuration, the integrated circuit device 500 includes a first substrate 502 having a ground plane 510 along a length of the first substrate 502. The integrated circuit device 500 also includes a second substrate 520 (e.g., a passive substrate) having a first passive device layer 530 on a first side 522 of the second substrate 520. In addition, the second substrate 520 further includes a second passive device layer 540 on a first side 524 of the second substrate 520. The first passive device layer 530 and the second passive device layer 540 include inductors (not shown) having a first inductor magnetic field 532 and a second inductor magnetic field 542. The first passive device layer 530 and the second passive device layer 540 may include passive devices and components implemented as passive on glass devices, integrated passive devices, or other like passive devices, for example, as shown in FIGS. 2A and 2B.

In the configuration shown in FIG. 5, the second substrate 520 is arranged in a direction substantially orthogonal relative to a ground plane 510 of the first substrate 502. In this configuration of the second substrate 520, the first inductor magnetic field 532 and the second inductor magnetic field 542 are substantially parallel to the ground plane 510 of the first substrate 502. As a result, the ground plane 510 does not degrade the performance of the passive devices in the first passive device layer 530 or the second passive device layer 540. Instead, the first inductor magnetic field 532 and the second inductor magnetic field 542 are substantially parallel to the ground plane 510 of the first substrate 502 to prevent any negative interaction.

In this configuration, a first conductive interconnect 550 (e.g., a solder ball) is fabricated on a surface 504 of the first substrate 502 to provide lateral support for the second substrate 520 and to electrically couple the first substrate 502 to the first passive device layer 530. In addition, a second conductive interconnect 552 is fabricated on the surface 504 of the first substrate 502 to provide additional lateral support for the second substrate 520 and to electrically couple the first substrate 502 to the second passive device layer 540. In an alternative configuration, a first layer of solder paste may couple the first passive device layer 530 to the first substrate 502. In addition, a second layer of solder paste may couple the second passive device layer 540 to the first substrate 502.

Figure 6:
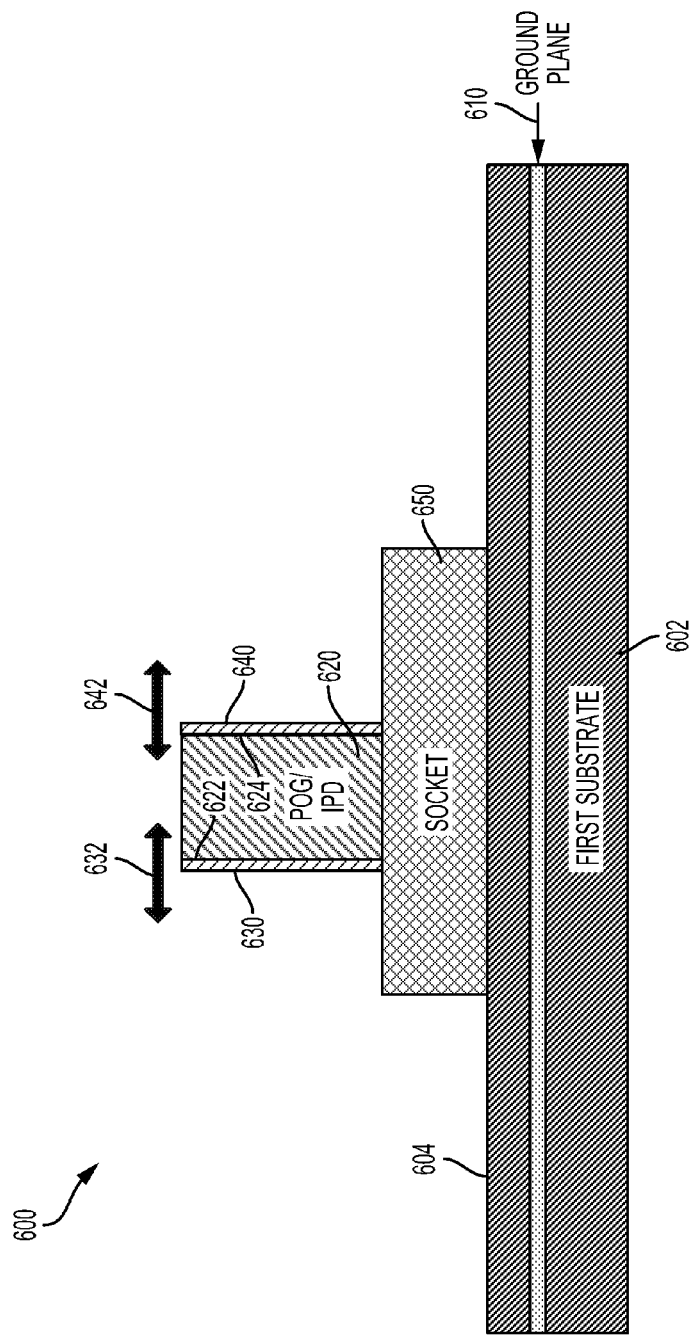
FIG. 6 is a block diagram illustrating an integrated circuit (IC) device having dual-layer side-assembled passive devices, according to further aspects of the present disclosure.

FIG. 6 is a block diagram illustrating an integrated circuit device 600 having dual-layer side-assembled passive devices, according to further aspects of the present disclosure. In this configuration, the integrated circuit device 600 includes a first substrate 602 having a ground plane 610 along a length of the first substrate 602. The integrated circuit device 600 also includes a second substrate 620 having a first passive device layer 630 on a first side 622 of the second substrate 620. In addition, the second substrate 620 further includes a second passive device layer 640 on a first side 624 of the second substrate 620. The first passive device layer 630 and the second passive device layer 640 include inductors (not shown) having a first inductor magnetic field 632 and a second inductor magnetic field 642.

In this configuration shown in FIG. 6, the second substrate 620 is arranged in a direction substantially orthogonal relative to a ground plane 610 of the first substrate 602. In this arrangement of the second substrate 620, the first inductor magnetic field 632 and the second inductor magnetic field 642 are substantially parallel to the ground plane 610 of the first substrate 602. As a result, the ground plane 610 does not degrade the performance of the passive devices in the first passive device layer 630 or the second passive device layer 640. Instead, the first inductor magnetic field 632 and the second inductor magnetic field 642 are substantially parallel to the ground plane 610 of the first substrate 602 to prevent any negative interaction.

In this configuration, a socket 650 replaces the first conductive interconnect 550 and the second conductive interconnect 552 shown in FIG. 5. In this aspect of the disclosure, the socket 650 is fabricated on a surface 604 of the first substrate 602 to provide lateral support for the second substrate 620 and to electrically couple the first substrate 602 to the first passive device layer 630. In addition, electrically couples the first substrate 602 to the second passive device layer 640.

Alternatively, a first wire bond may couple the first substrate 602 to the first passive device layer 630. In addition, a second wire bond may couple the second passive device layer 640 to the first substrate 602, according to aspects of the present disclosure. In a further aspect of the present disclosure, a semiconductor die (not shown) may be arranged on the first substrate 602. In addition, a wire bond may couple the first passive device layer 630 and/or the second passive device layer 640 to the semiconductor die.

In the arrangements shown in FIGS. 4-6, the second substrate (e.g., 420, 520, 620) including the passive device layers (e.g., 430, 530, 630, 540, 640) may have a two (2) to one (1) (2:1) aspect ratio. Although not drawn to scale, in this configuration, a height of the second substrate (e.g., 420, 520, and 620) may be in the range of two-hundred fifty (250) microns. In addition, a thickness of the second substrate (e.g., 520, 620) for the configuration shown in FIGS. 5 and 6 may be selected to account for the inductors magnetic fields (e.g., 532, 542, 632, and 642). In one configuration, the height is 2 mm, although it can be smaller, for example 0.6 mm to 0.8 mm.

Figure 7:
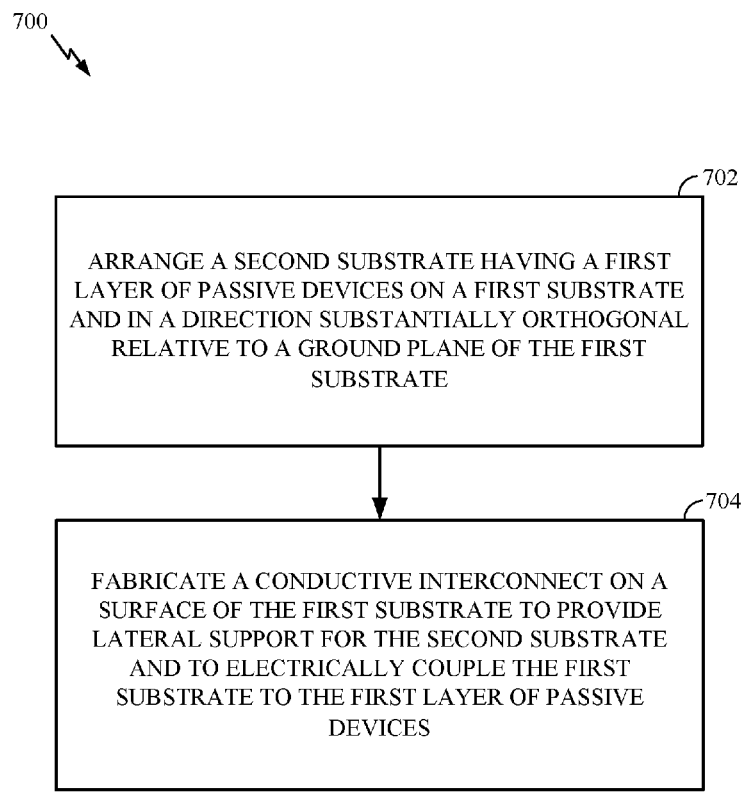
FIG. 7 is a method for making an integrated circuit (IC) device including side-assembled passives according to aspects of the present disclosure.

FIG. 7 shows a method 700 for making an integrated circuit device including side-assembled passive devices according to aspects of the present disclosure. In block 702, a second substrate, having a first layer of passive devices including an inductor on a first side of the second substrate, is arranged on a first substrate and in a direction substantially orthogonal relative to a ground plane of the first substrate. For example, as shown in FIG. 4, a second substrate 420 includes a first passive device layer 430 having an inductor (not shown) on a first surface of the substrate 420 with an inductor magnetic field 432. According to aspects of the present disclosure, by arranging the substrate 420 in a direction substantially orthogonal relative to a ground plane 410 of the first substrate 402, the inductor magnetic field 432 is substantially parallel to the ground plane 410 of the first substrate 402.

In block 704, a conductive interconnect is fabricated on a surface of the first substrate to provide lateral support for the second substrate and to electrically couple the first substrate to the first layer of passive devices. For example, as shown in FIG. 4, the conductive interconnect 450 (e.g., solder ball) is fabricated on the surface of the first substrate 402 to provide lateral support for the second substrate 420. The conductive interconnect 450 (e.g., solder ball) also electrically couples the first passive device layer 430 to the first substrate 402.

According to a further aspect of the present disclosure, an integrated circuit device, including orthogonally arranged passive device layers, is described. The integrated circuit device is arranged so that an inductor magnetic field is substantially parallel to a ground plane. The integrated circuit device includes means for providing lateral support for the second substrate and electrically coupling the first substrate to the first layer of passive devices. The lateral support providing means may be the conductive interconnect 450, shown in FIG. 4, the first conductive interconnect 550 and the second conductive interconnect 522, shown in FIG. 5, or the socket 650, shown in FIG. 6. In another aspect, the aforementioned means may be any module or any apparatus configured to perform the functions recited by the aforementioned means.

The implementation of carrier aggregation in mobile RF transceivers enables a wireless carrier to increase data throughput. While an increased amount of data is provided to the end user, successful implementation of carrier aggregation is complicated by noise created at the harmonic frequencies due to the frequencies used for data transmission. This noise is reduced when passive devices are used to process signals carried in a carrier aggregation system. Unfortunately, eddy currents generated by inductors may negatively affect the performance of mobile RF transceivers when the eddy currents are orthogonal to a ground plane of the system board in the mobile RF transceivers.

Aspects of the present disclosure are directed to side-assembled passive devices. In one arrangement, an integrated circuit device includes a first substrate having a ground plane. The first substrate may be a printed circuit board (PCB), a packaging substrate, an interposer or other like system board. The integrated circuit device also includes a second substrate (e.g., a glass substrate) having a first layer of passive devices on a first side of the second substrate. The second substrate may be arranged on the first substrate in a direction that is substantially orthogonal relative to the first substrate. In this configuration, the first passive device layer is arranged substantially orthogonal to the ground plane of the first substrate.

According to aspects of the present disclosure, a conductive interconnect may provide lateral support for the second substrate on the first substrate. For example, a first solder ball on the surface of the first substrate may provide lateral support for the second substrate. The solder ball may also electrically couple the first substrate to the first passive device layer. Alternatively, the integrated circuit (IC) device includes a first solder ball on the surface of the first substrate, providing lateral support to the second substrate. The first solder ball electrically couples the first substrate to the first passive device layer. The IC device may also include a second solder ball on the surface of the first substrate, providing additional lateral support to the second substrate. The second solder ball electrically couples the first substrate to a second layer of passive devices opposite the first passive device layer on a second surface of the second substrate.

Figure 8:
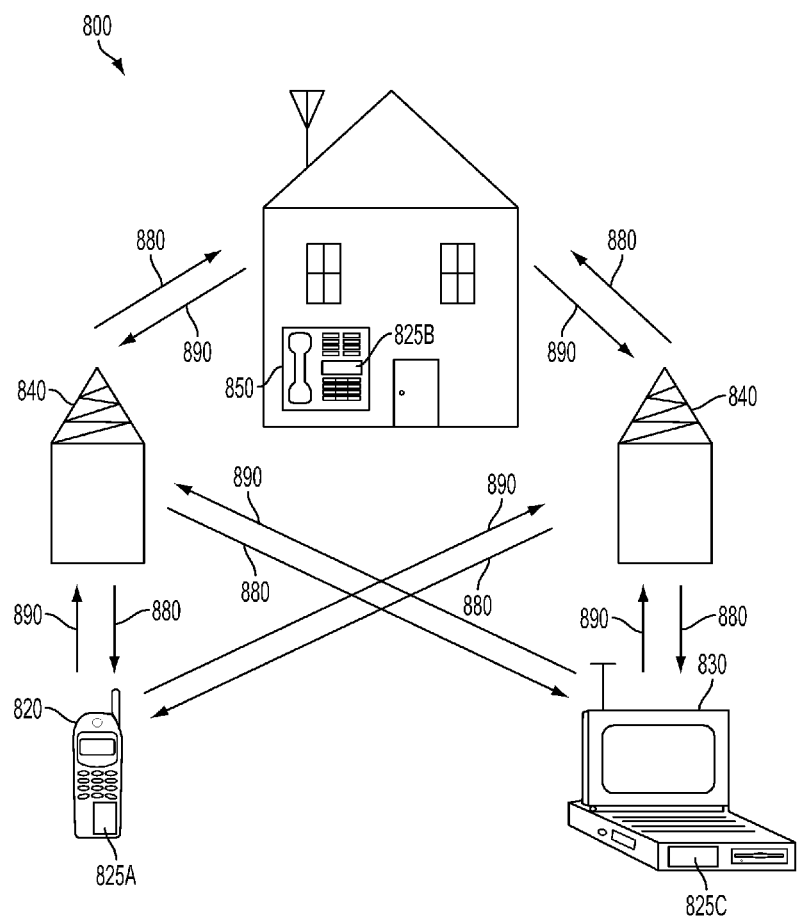
FIG. 8 is a block diagram showing an exemplary wireless communication system in which an aspect of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed side-assembled passive devices. It will be recognized that other devices may also include the disclosed side-assembled passive devices, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit such as a personal digital assistant (PDA), a GPS enabled device, a navigation device, a set top box, a music player, a video player, a communications device, an entertainment unit, a fixed location data unit such as a meter reading equipment, or other devices that store or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed side-assembled passive devices.

Figure 9:
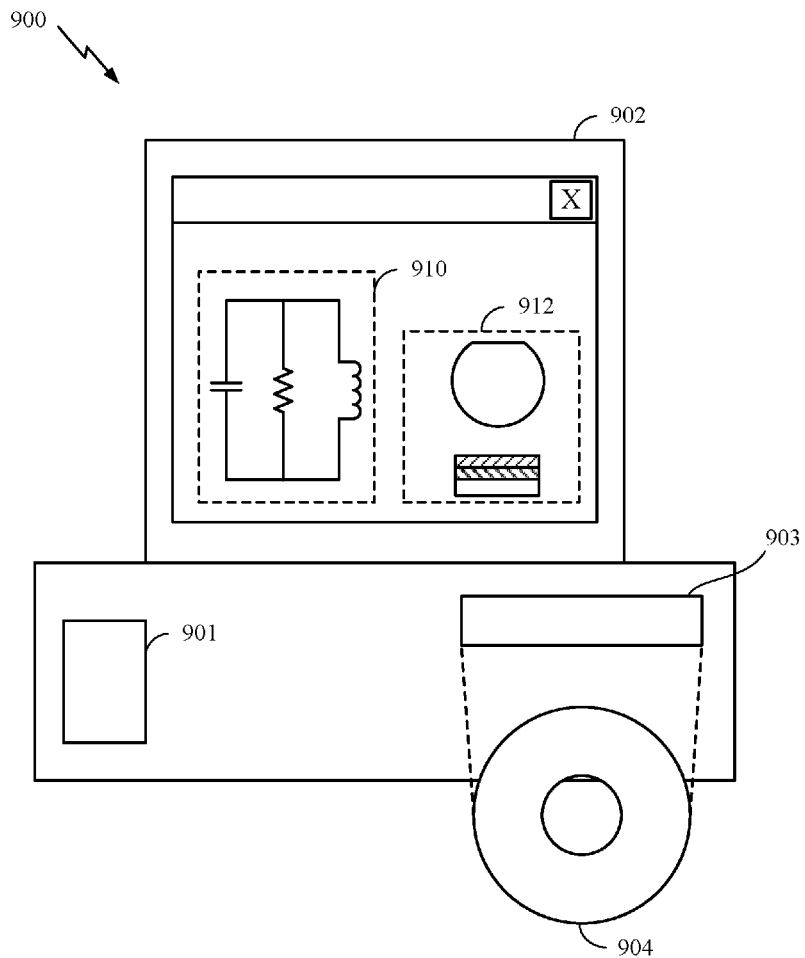
FIG. 9 is a block diagram illustrating a design workstation used for circuit, layout, and logic design of a fin-based structure according to one aspect of the present disclosure.

FIG. 9 is a block diagram illustrating a design workstation used for circuit, layout, and logic design of the multi-density metal-insulator-metal (MIM) capacitors disclosed above. A design workstation 900 includes a hard disk 901 containing operating system software, support files, and design software such as Cadence or OrCAD. The design workstation 900 also includes a display 902 to facilitate design of a circuit 910 or the side-assembled passive devices 912. A storage medium 904 is provided for tangibly storing the design of the circuit 910 or the side assembled passive devices 912. The design of the circuit 910 or the side assembled passive devices 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the side assembled passive devices 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An integrated circuit device, comprising:
    a first substrate having a ground plane; and
    a second substrate having a first layer of passive devices including at least one inductor on a first side of the second substrate, the first layer of passive devices being substantially orthogonal to the ground plane, the second substrate supported by the first substrate, in which an inductor magnetic field is substantially parallel to the ground plane, and the first substrate is substantially orthogonal to the second substrate.

2. The integrated circuit device of claim 1, in which the first substrate comprises one of a printed circuit board (PCB), a packaging substrate, or an interposer.

3. The integrated circuit device of claim 1, in which the second substrate comprises a glass substrate.

4. The integrated circuit device of claim 1, in which the first layer of passive devices further comprises at least one capacitor coupled to the at least one inductor.

5. The integrated circuit device of claim 1, further comprising a solder ball on the first substrate, the solder ball providing lateral support for the second substrate and electrically coupling the first substrate to the first layer of passive devices.

6. The integrated circuit device of claim 1, further comprising one of a wire bond or a solder paste coupling the first layer of passive devices to the first substrate.

7. The integrated circuit device of claim 1, further comprising:
    a second layer of passive devices on a second side of the second substrate, opposite the first side of the second substrate; and
    a via coupling the first layer of passive devices to the second layer of passive devices.

8. The integrated circuit device of claim 1, in which the at least one inductor comprises one of a three-dimensional (3D) inductor and a two-dimensional (2D) spiral inductor.

9. The integrated circuit device of claim 1, further comprising:
    a second layer of passive devices on a second side of the second substrate, opposite the first side of the second substrate;
    a first solder ball on the first substrate, the first solder ball laterally supporting the second substrate and electrically coupling the first substrate to the first layer of passive devices; and
    a second solder ball on the first substrate, the second solder ball laterally supporting the second substrate and electrically coupling the first substrate to the second layer of passive devices.

10. The integrated circuit device of claim 1, further comprising:
    a second layer of passive devices on a second side of the second substrate, opposite the first side of the second substrate;
    a first wire bond coupling the first layer of passive devices to the first substrate; and
    a second wire bond coupling the second layer of passive devices to the first substrate.

11. The integrated circuit device of claim 1, further comprising:

a second layer of passive devices on a second side of the second substrate, opposite the first side of the second substrate;
a first layer of solder paste coupling the first layer of passive devices to the first substrate; and
a second layer of solder paste coupling the second layer of passive devices to the first substrate.

12. The integrated circuit device of claim 1, further comprising a socket on the first substrate, the socket supporting the second substrate and coupling the first layers of passive devices and a second layer of passive devices to the first substrate.

13. The integrated circuit device of claim 1, further comprising:
a semiconductor die on the first substrate; and
a wire bond coupling the first layer of passive devices to the semiconductor die.

14. The integrated circuit device of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

15. An integrated circuit device, comprising:
a first substrate having a ground plane;
a second substrate having a first layer of passive devices including at least one inductor on a first side of the second substrate, the first layer of passive devices being substantially orthogonal to the ground plane, the second substrate supported by the first substrate, in which an inductor magnetic field is substantially parallel to the ground plane, and the first substrate is substantially orthogonal to the second substrate; and
means for providing lateral support for the second substrate and electrically coupling the first substrate to the first layer of passive devices.

16. The integrated circuit device of claim 15, further comprising:
a second layer of passive devices on a second side of the second substrate, opposite the first side of the second substrate; and
a via coupling the first layer of passive devices to the second layer of passive devices.

17. The integrated circuit device of claim 15, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

18. A method of making an integrated circuit device, comprising:
arranging a second substrate, having a first layer of passive devices including at least one inductor on a first side of the second substrate, on a first substrate and in a direction substantially orthogonal relative to the first substrate, in which an inductor magnetic field is substantially parallel to a ground plane of the first substrate; and
depositing a conductive interconnect on a surface of the first substrate to laterally support the second substrate and to electrically couple the first substrate to the first layer of passive devices.

19. The method of claim 18, in which depositing the conductive interconnect comprises fabricating a solder ball on the first substrate, the solder ball laterally supporting the second substrate and electrically coupling the first substrate to the first layer of passive devices.

20. The method of claim 18, further comprising integrating the integrated circuit device into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

* * * * *